(12) United States Patent
Jung et al.

(10) Patent No.: US 12,444,694 B2
(45) Date of Patent: Oct. 14, 2025

(54) SEMICONDUCTOR DEVICE AND METHOD OF FORMING SELECTIVE EMI SHIELDING WITH SLOTTED SUBSTRATE

(71) Applicant: STATS ChipPAC Pte. Ltd., Singapore (SG)

(72) Inventors: JinHee Jung, Incheon (KR); ChangOh Kim, Incheon (KR); JiWon Lee, Seoul (KR); YuJeong Jang, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 799 days.

(21) Appl. No.: 17/647,055

(22) Filed: Jan. 5, 2022

(65) Prior Publication Data

US 2023/0215812 A1 Jul. 6, 2023

(51) Int. Cl.
| | |
|---|---|
| *H01L 25/16* | (2023.01) |
| *H01L 21/26* | (2006.01) |
| *H01L 21/50* | (2006.01) |
| *H01L 21/52* | (2006.01) |
| *H01L 21/56* | (2006.01) |
| *H01L 21/78* | (2006.01) |
| *H01L 23/12* | (2006.01) |
| *H01L 23/552* | (2006.01) |

(52) U.S. Cl.
CPC .......... *H01L 23/552* (2013.01); *H01L 21/561* (2013.01); *H01L 21/78* (2013.01)

(58) Field of Classification Search
CPC ..... H01L 23/552; H01L 21/561; H01L 21/78; H01L 25/16; H01L 23/3121; H01L 25/50; H01L 21/50; H01L 21/52; H01L 21/56; H01L 23/12
See application file for complete search history.

(56) References Cited

U.S. PATENT DOCUMENTS

| | | | |
|---|---|---|---|
| 8,030,750 B2 | 10/2011 | Kim et al. | |
| 8,654,537 B2 | 2/2014 | Fisher, Jr. et al. | |
| 8,897,019 B1* | 11/2014 | Shimamura | H05K 9/0024 |
| 10,910,322 B2 | 2/2021 | Kim et al. | |
| 2013/0134559 A1* | 5/2013 | Lin | H01L 21/486 |
| | | | 257/E23.179 |
| 2016/0351509 A1* | 12/2016 | Dang | H01L 21/268 |
| 2017/0186705 A1* | 6/2017 | Malatkar | H01L 23/49838 |
| 2020/0194379 A1* | 6/2020 | Kim | H01L 24/09 |
| 2021/0066204 A1* | 3/2021 | Oh | H01L 21/76816 |

* cited by examiner

*Primary Examiner* — Brent A. Fairbanks
*Assistant Examiner* — Daniel J Hibbert
(74) *Attorney, Agent, or Firm* — Brian M. Kaufman; Robert D. Atkins; PATENT LAW GROUP: Atkins and Associates, P.C.

(57) ABSTRACT

A semiconductor device has a substrate and a slot formed in the substrate. A first electrical component is disposed over the substrate adjacent to the slot. An encapsulant is deposited over the first electrical component with a surface of the encapsulant coplanar to a surface of the substrate within the slot. A shielding layer is formed over the encapsulant and physically contacting the surface of the substrate within the slot. The substrate is singulated to form a semiconductor package with the first electrical component after forming the shielding layer.

25 Claims, 15 Drawing Sheets

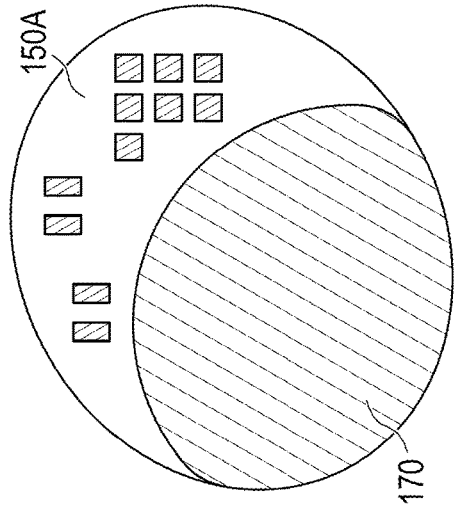
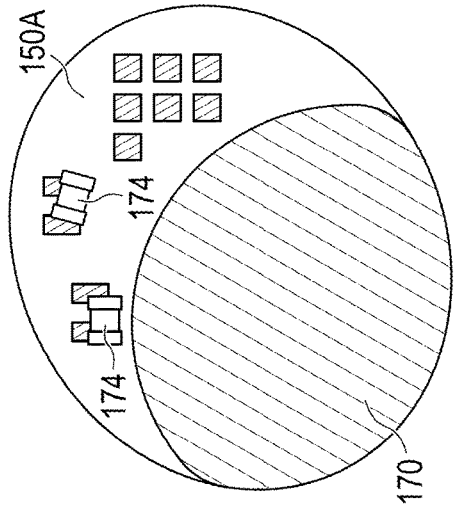
FIG. 2f
(PRIOR ART)
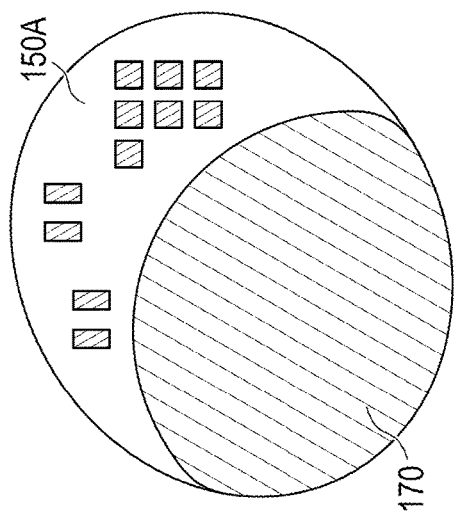
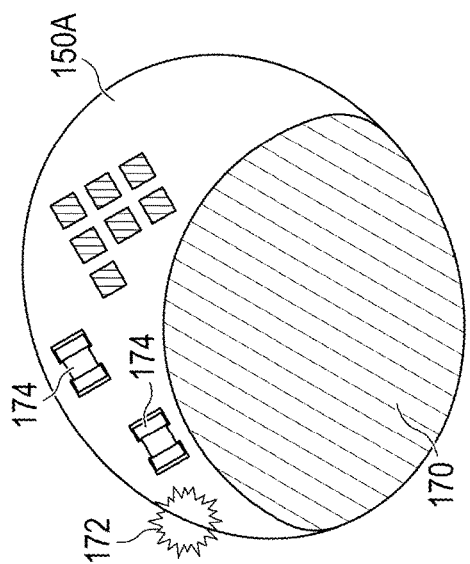
FIG. 2g
(PRIOR ART)

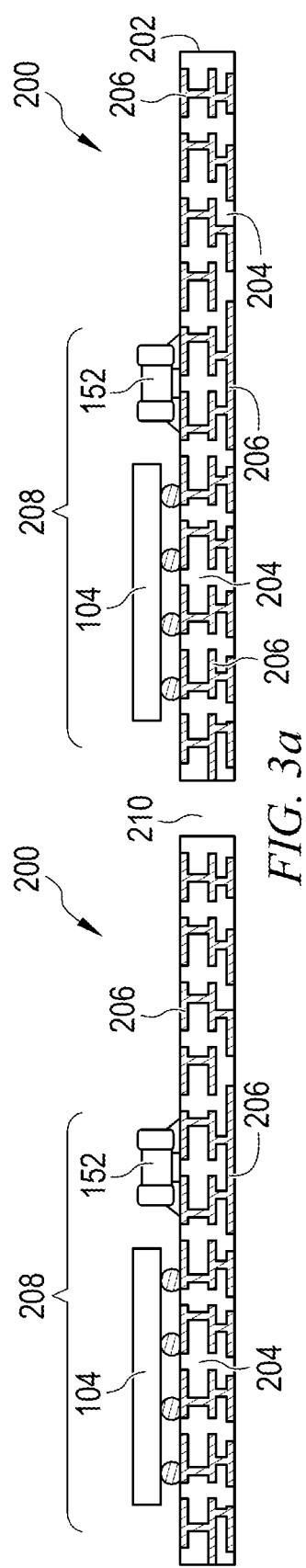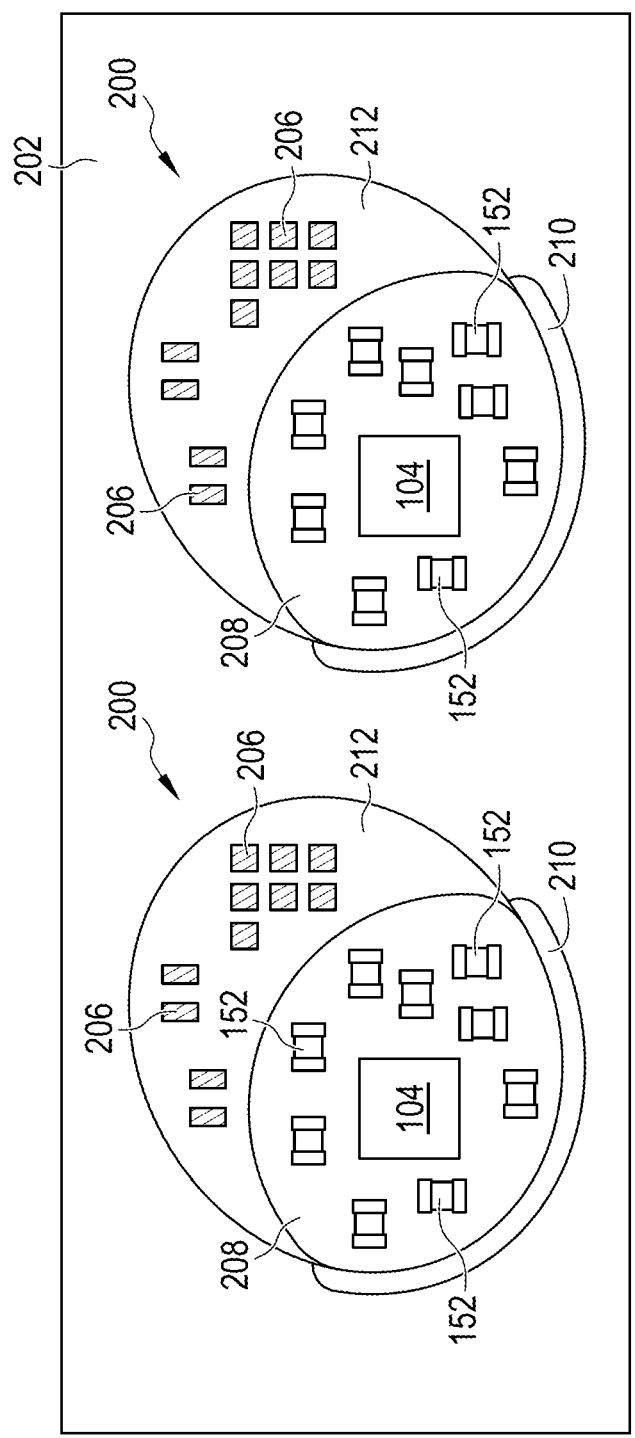
FIG. 3a
FIG. 3b

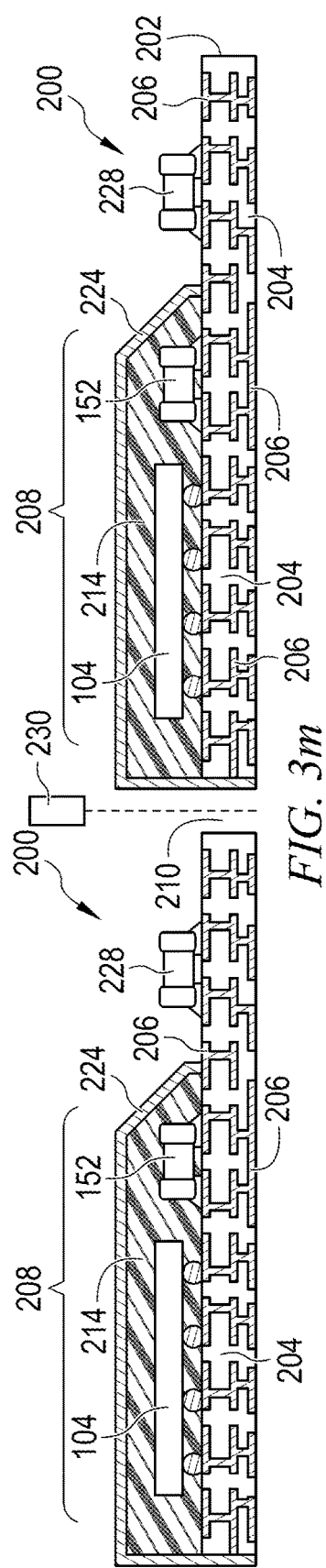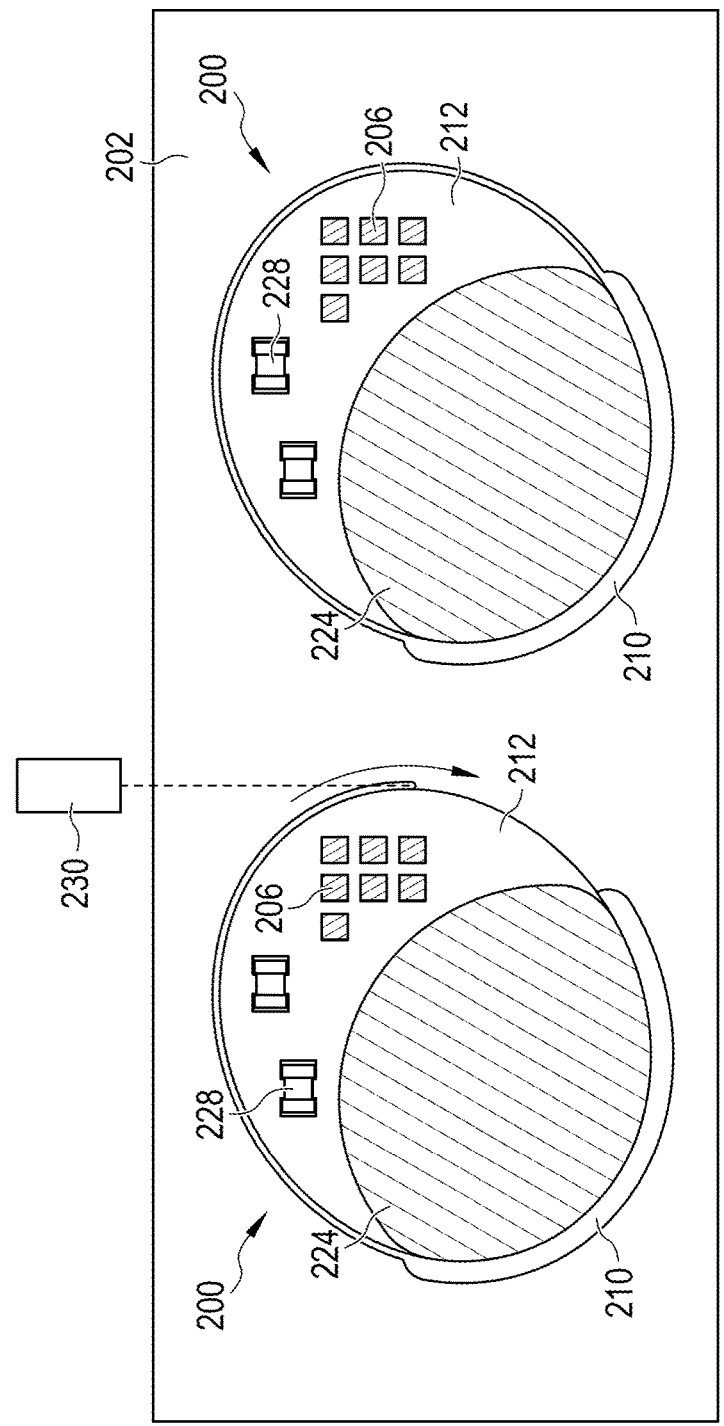
FIG. 3m
FIG. 3n

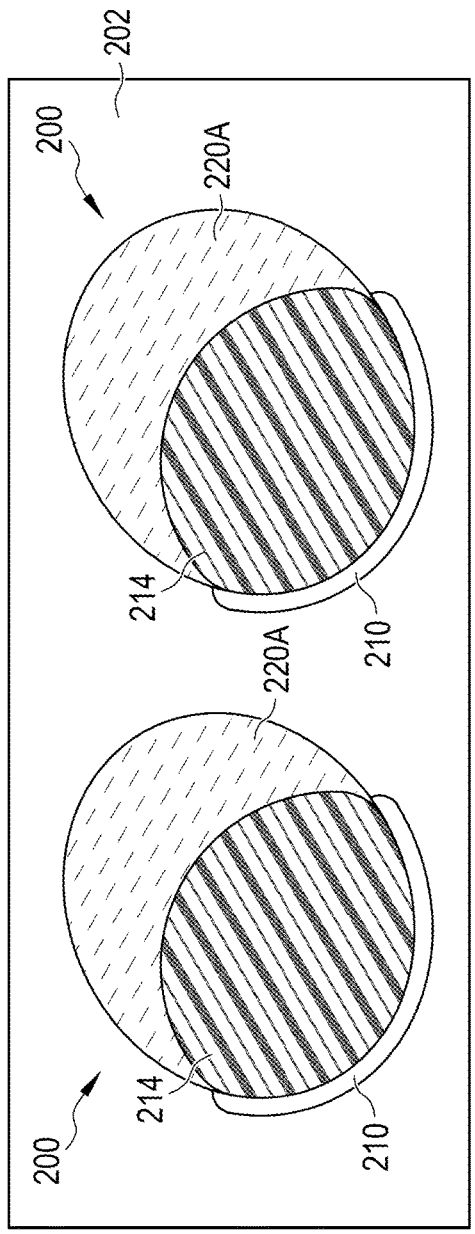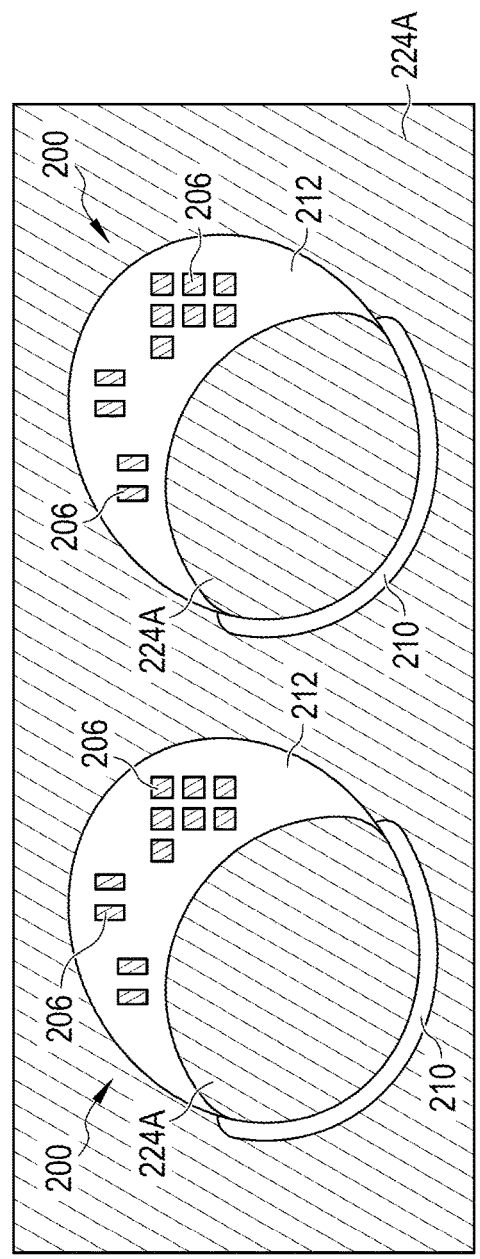

SEMICONDUCTOR DEVICE AND METHOD OF FORMING SELECTIVE EMI SHIELDING WITH SLOTTED SUBSTRATE

FIELD OF THE INVENTION

The present invention relates in general to semiconductor devices and, more particularly, to a semiconductor device and a method of selective electromagnetic interference (EMI) shielding with a slotted substrate.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, bond wires, or other suitable interconnect structure. An encapsulant or other molding compound is deposited over the package to provide physical support and electrical isolation. The finished package is then inserted into an electrical system and the functionality of the semiconductor device is made available to the other system components.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk semiconductor material. A plurality of semiconductor die or components 104 is formed on wafer 100 separated by a non-active, inter-die wafer area or saw street 106 as described above. Saw street 106 provides cutting areas to singulate semiconductor wafer 100 into individual semiconductor die 104. In one embodiment, semiconductor wafer 100 has a width or diameter of 100-450 millimeters (mm).

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within or over the die and electrically interconnected according to the electrical design and function of the die. For example, the circuit may include one or more transistors, diodes, and other circuit elements formed within active surface 110 to implement analog circuits or digital circuits, such as digital signal processor (DSP), ASIC, MEMS, memory, or other signal processing circuit. Semiconductor die 104 may also contain integrated passive devices (IPDs), such as inductors, capacitors, and resistors, for RF signal processing. Back surface 108 of semiconductor wafer 100 may undergo an optional backgrinding operation with a mechanical grinding or etching process to remove a portion of base material 102 and reduce the thickness of semiconductor wafer 100 and semiconductor die 104.

An electrically conductive layer 112 is formed over active surface 110 using PVD, CVD, electrolytic plating, electroless plating process, or other suitable metal deposition process. Conductive layers 112 include one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

Conductive layer 112 can be formed as contact pads disposed side-by-side a first distance from the edge of semiconductor die 104, as shown in FIG. 1b. Alternatively, conductive layer 112 can be formed as contact pads that are offset in multiple rows such that a first row of contact pads is disposed a first distance from the edge of the die, and a second row of contact pads alternating with the first row disposed a second distance from the edge of the die. Conductive layer 112 represents the last conductive layer formed over semiconductor die 104 with contact pads for subsequent electrical interconnect to a larger system. However, there may be one or more intermediate conductive and insulating layers formed between the actual semiconductor devices on active surface 110 and contact pads 112 for signal routing.

An electrically conductive bump material is deposited over conductive layer 112 using an evaporation, electrolytic plating, electroless plating, ball drop, or screen printing process. The bump material can be Al, Sn, Ni, Au, Ag, lead (Pb), bismuth (Bi), Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form conductive balls or bumps 114. In one embodiment, conductive bumps 114 are formed over an under bump metallization (UBM) having a wetting layer, barrier layer, and adhesion layer. Conductive bumps 114 can also be compression bonded or thermocompression bonded to conductive layer 112. Conductive bumps 114 represent one type of interconnect structure that can be formed over conductive layer 112 for electrical connection to a substrate. The interconnect structure can also use bond wires, conductive paste, stud bump, micro bump, conductive pillars, or other electrical interconnect.

In FIG. 1c, semiconductor wafer 100 is singulated through saw street 106 using a saw blade or laser cutting tool 118 into individual semiconductor die 104. The individual semiconductor die 104 can be inspected and electrically tested for identification of KGD post-singulation.

One method of forming a semiconductor package with semiconductor die 104 is shown in FIGS. 2a-2g. One or more discrete components 152 can be disposed over a package substrate 150 with semiconductor die 104 to provide additional functionality. An encapsulant 154 is deposited over substrate 150, semiconductor die 104, and discrete component 152 in FIG. 2b.

Semiconductor devices are often susceptible to electromagnetic interference (EMI), radio frequency interference (RFI), harmonic distortion, or other inter-device interference, such as capacitive, inductive, or conductive coupling, also known as cross-talk, which can interfere with their operation. High-speed analog circuits, e.g., radio frequency (RF) filters, or digital circuits also generate interference.

Conductive layers are commonly formed over semiconductor packages to shield electronic parts within the package from EMI and other interference. A conductive layer is sputtered onto encapsulant 154 to form a shielding layer over and around the components. Shielding layers absorb EMI before the signals can affect semiconductor die and discrete components within the package, which might malfunction without shielding. Shielding layers are also formed over packages with components that are expected to generate EMI to protect nearby devices.

The conductive layer formed over the package will commonly need to be formed down a side surface of substrate 150 in order to physically contact conductive layers of the substrate and thereby be electrically connected to ground. Therefore, packages are commonly singulated prior to forming the shielding layer, as shown in FIG. 2c where a laser cutting tool 160 is singulating substrate 150. FIG. 2d shows a plan view where a round package is being formed. Trenches 162 are formed all the way around each package to singulate the package from the larger panel of substrate 150. Substrate 150 is split into multiple parts by the singulation process: portion 150a remains as part of the plurality of semiconductor packages while portion 150b is the remaining panel that is removed after singulation to leave just the packages.

FIGS. 2e and 2f show shielding layer 170 formed over encapsulant 154. One issue that commonly occurs when handling singulated units is that the units can move during processing after singulation, resulting in manufacturing defects. FIG. 2g shows just two of the many different failure modes. Damage 172 can be caused by processing equipment trying to handle a package that has moved and is not in the expected location. Misplaced discrete devices 174 can cause malfunction if not properly connected to the underlying contact pads due to movement of the substrate prior to placement of the discrete components.

Processing semiconductor packages at the unit level provides many opportunities for manufacturing defects. Therefore, a need exists for an improved shielding layer manufacturing process and device that reduces the amount of processing after singulation.

BRIEF DESCRIPTION OF THE DRAWINGS

FIGS. 2a-2g illustrate forming shielded semiconductor packages;

FIGS. 4a and 4b illustrate an alternative process flow; and

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Figure 1A:
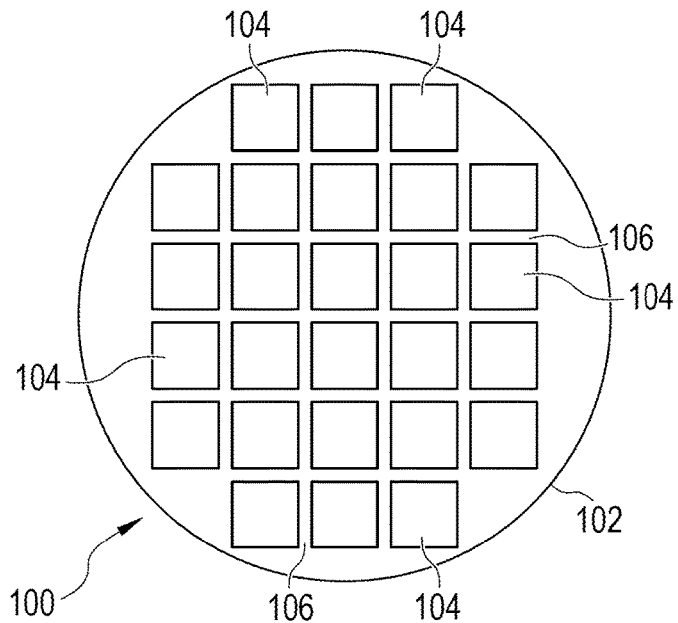
FIGS. 1a-1c illustrate a semiconductor wafer with a plurality of semiconductor die separated by a saw street.
Figure 1B:
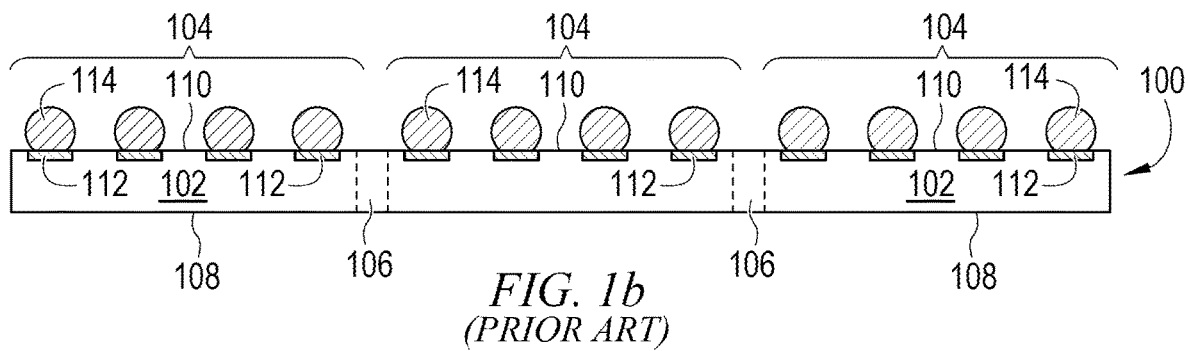
Figure 1C:
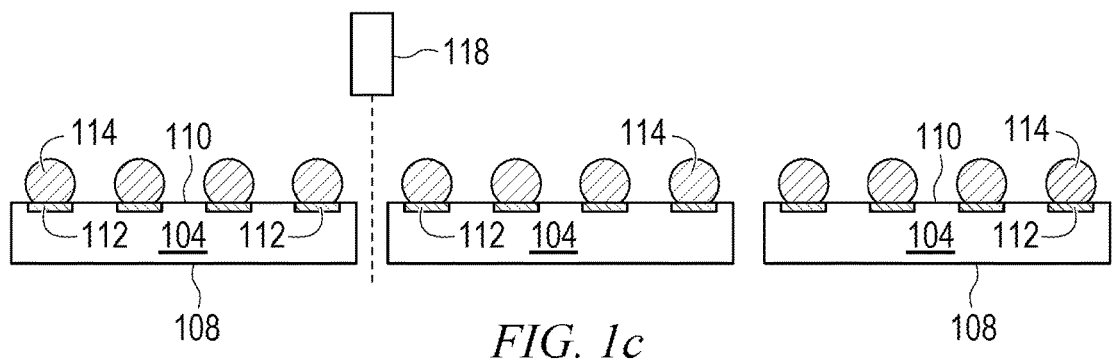
Figure 2A:
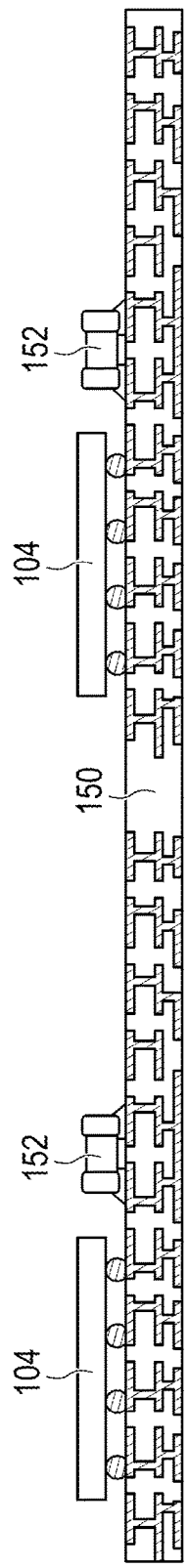
Figure 2B:
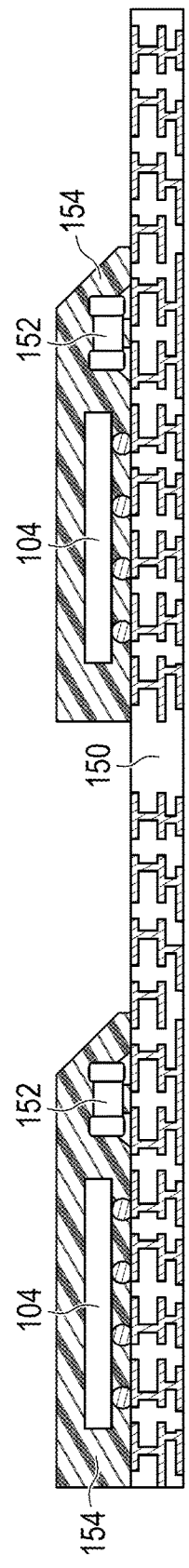
Figure 2C:
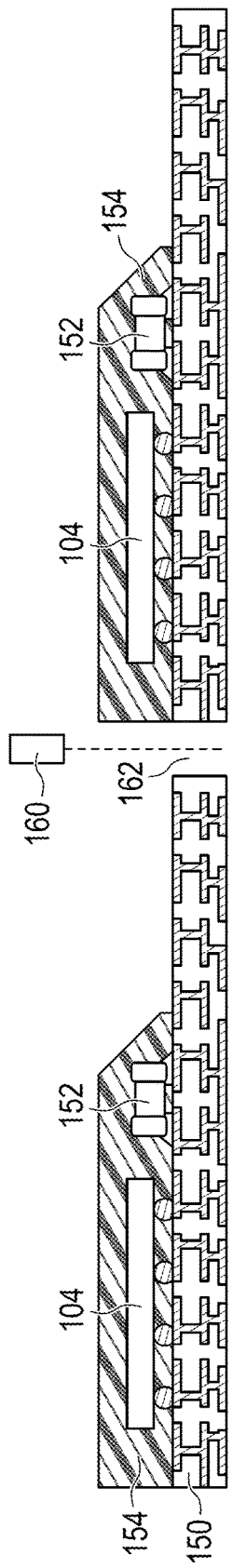
Figure 2D:
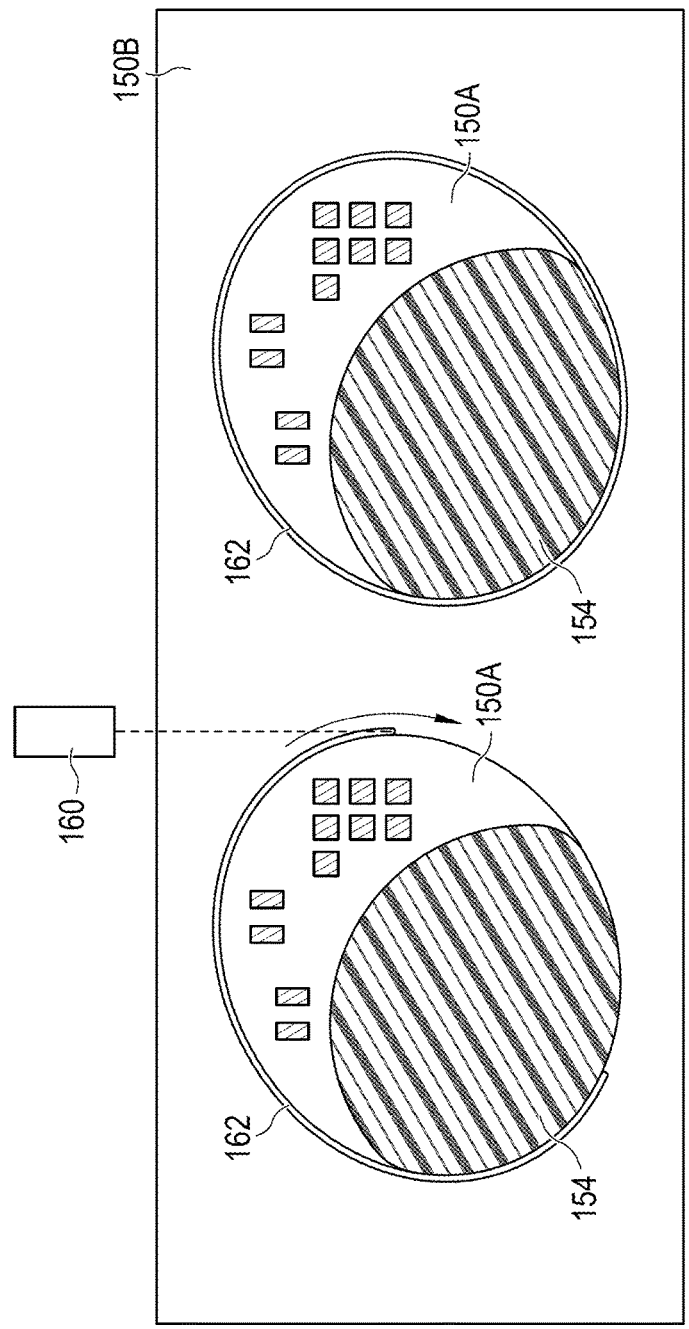
Figure 2E:
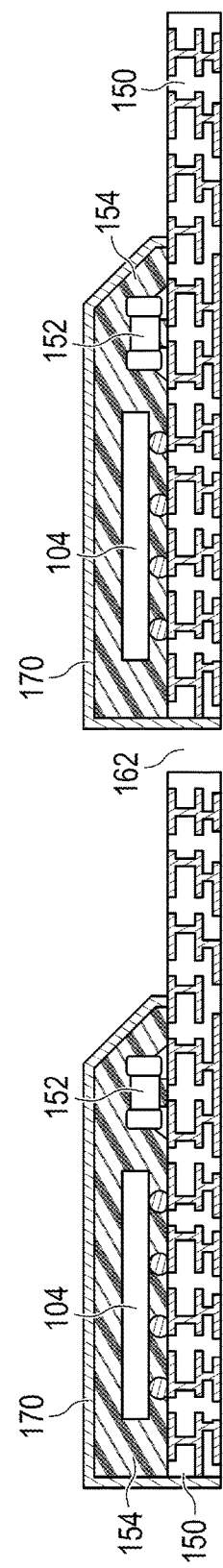
Figure 3C:
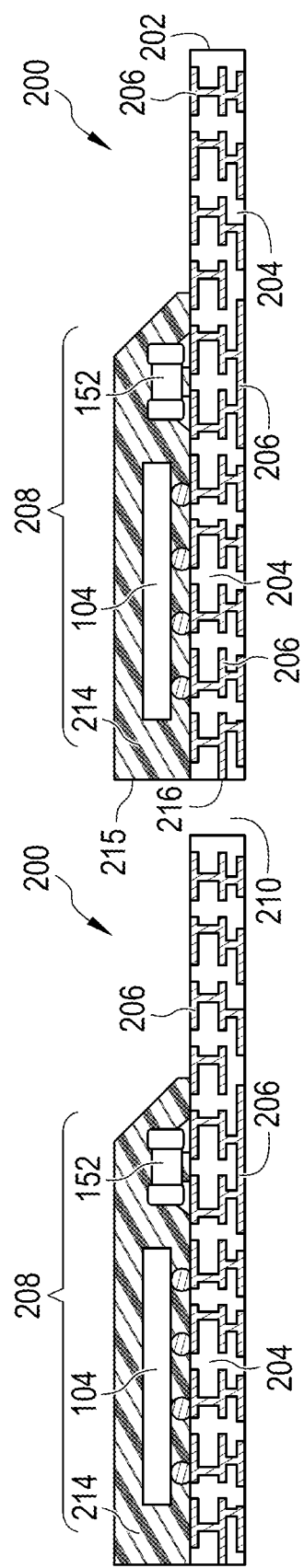
FIGS. 3a-3o illustrate forming shielded semiconductor packages with singulation occurring after the shielding layer is formed.
Figure 3D:
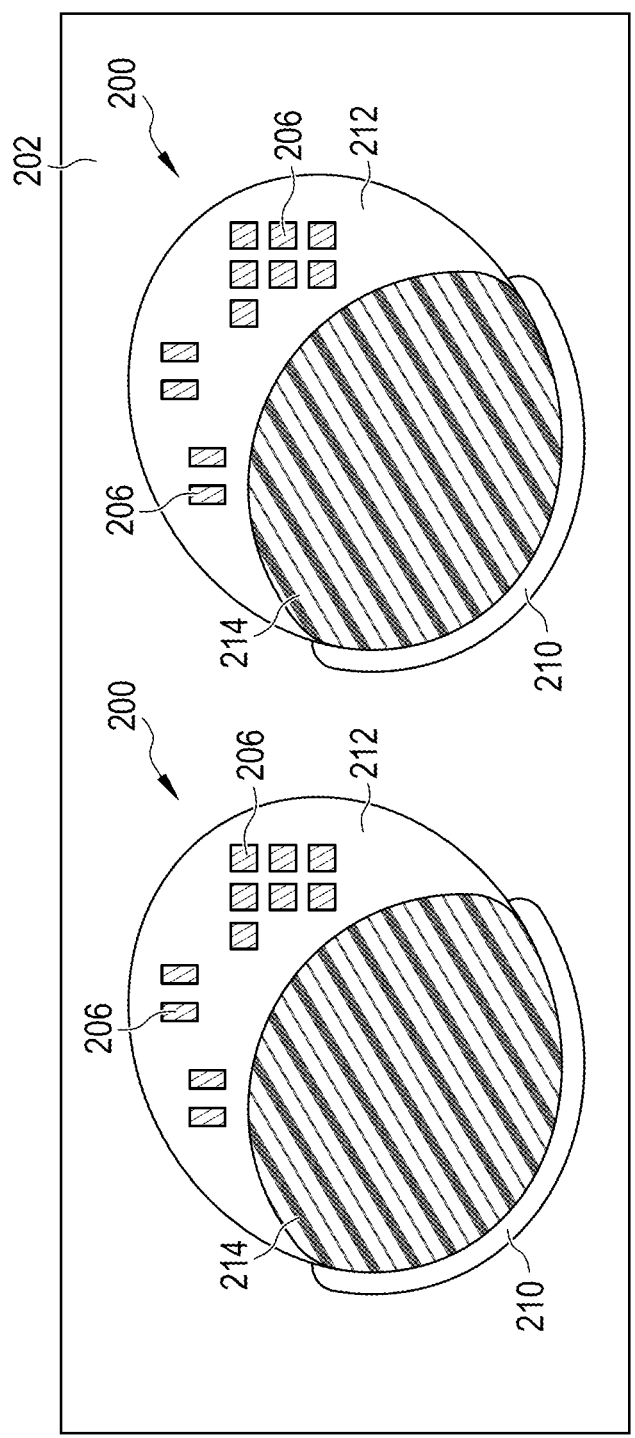
Figure 3E:
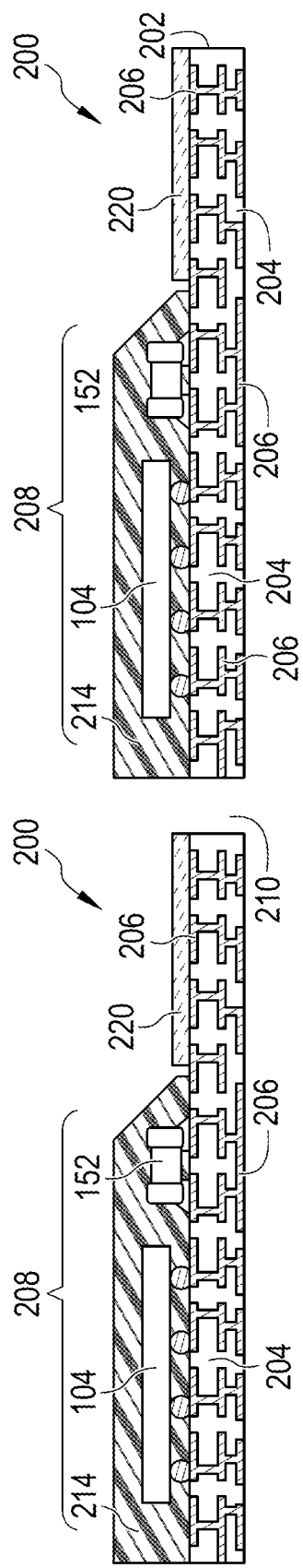
Figure 3F:
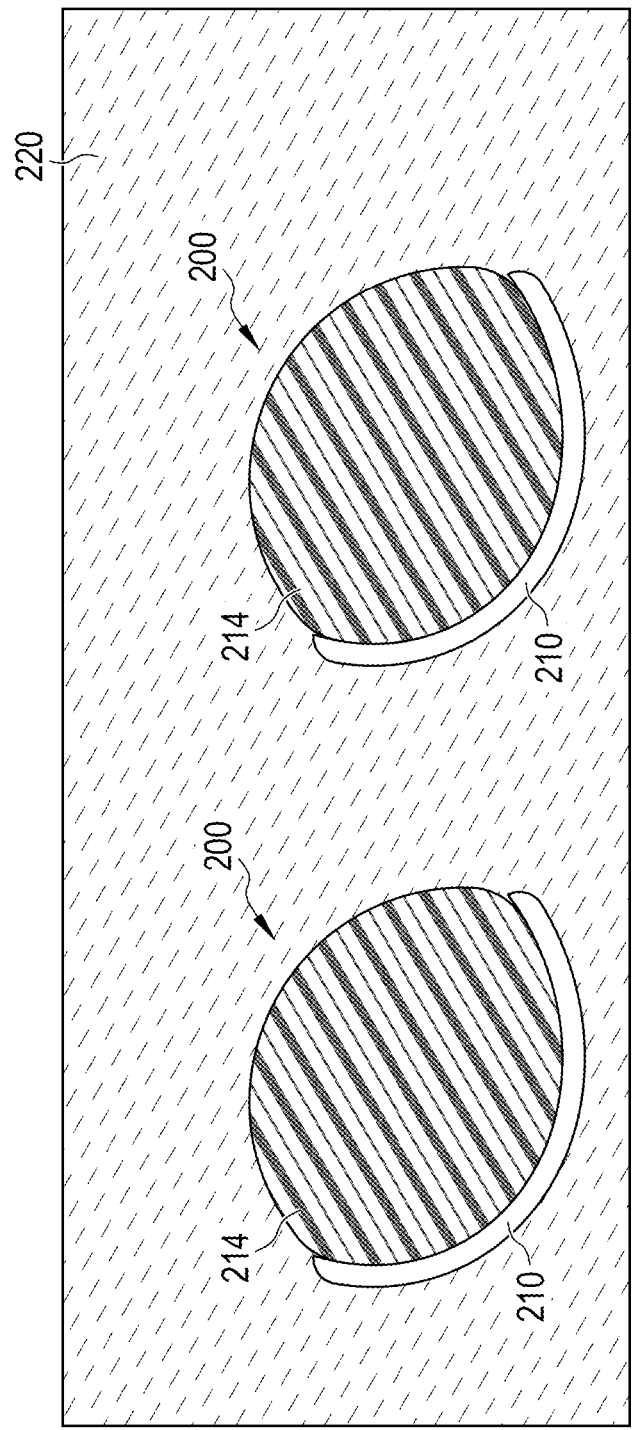
Figure 3G:
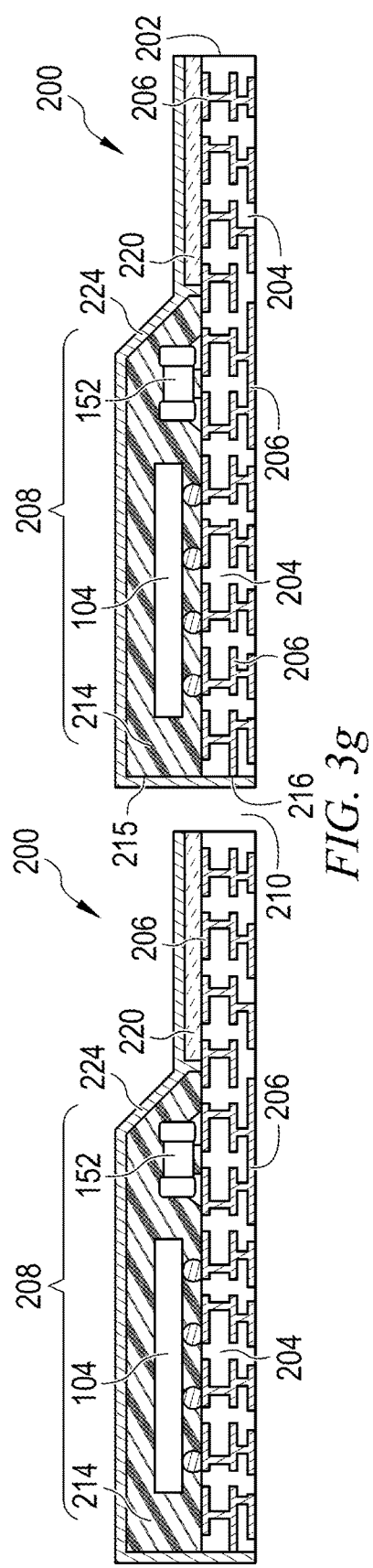
Figure 3H:
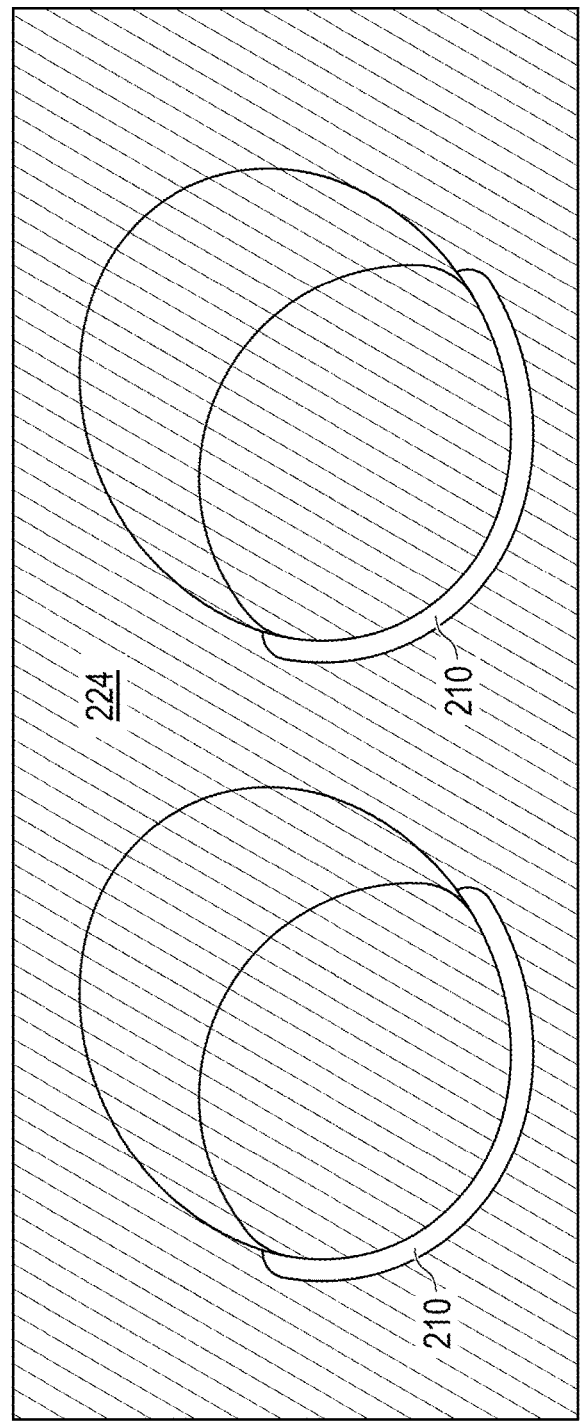
Figure 3I:
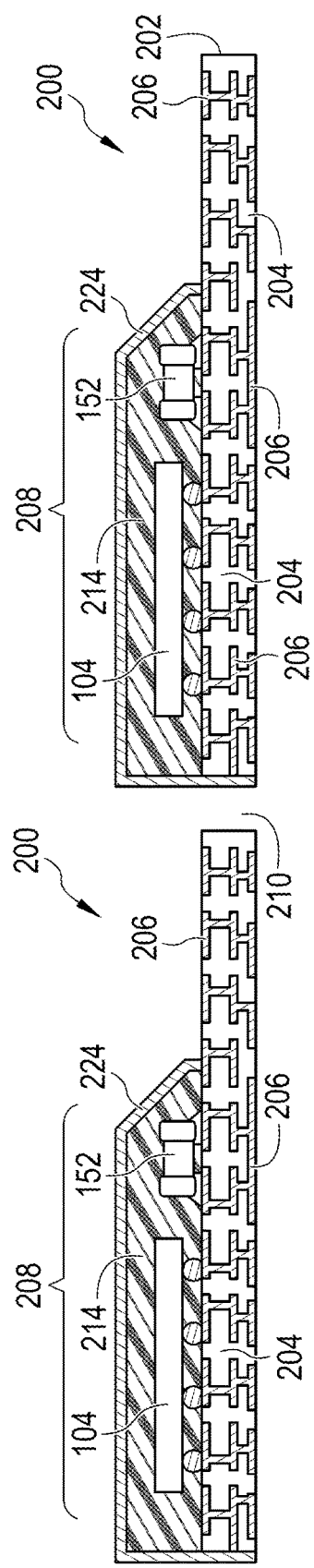
Figure 3J:
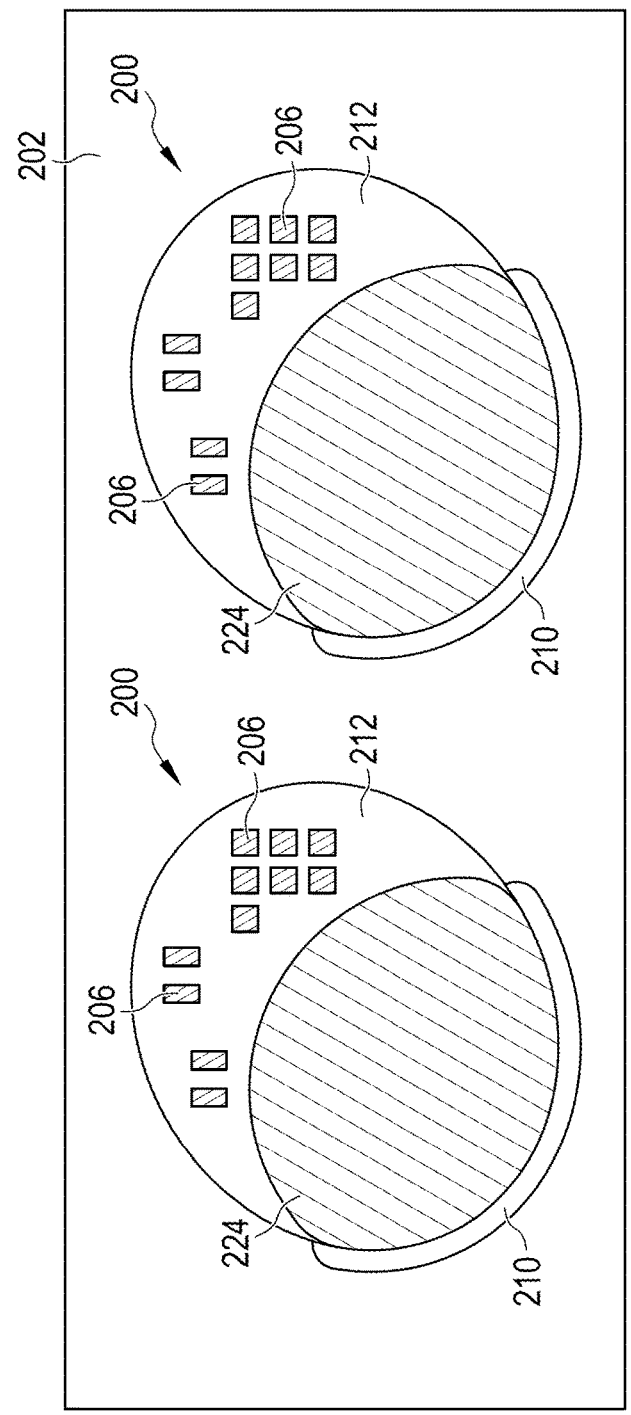
Figure 3K:
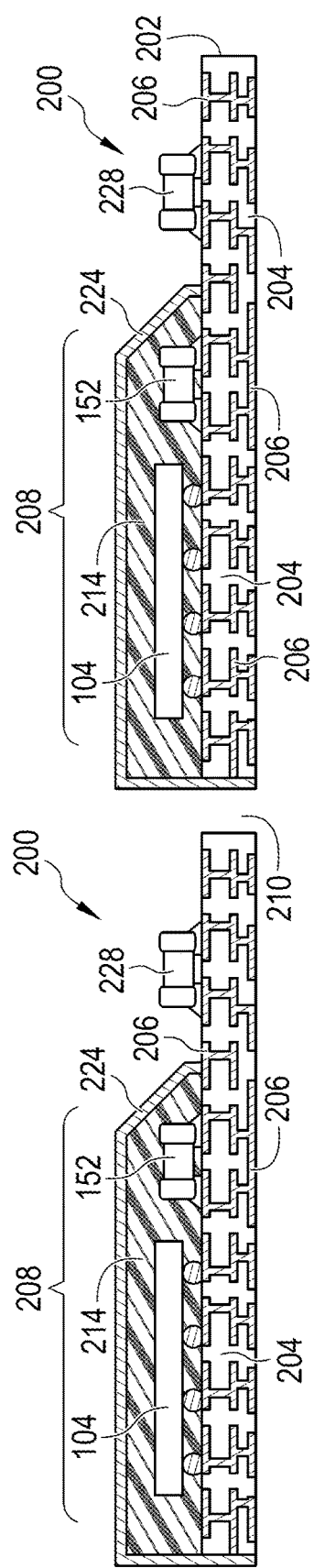
Figure 3L:
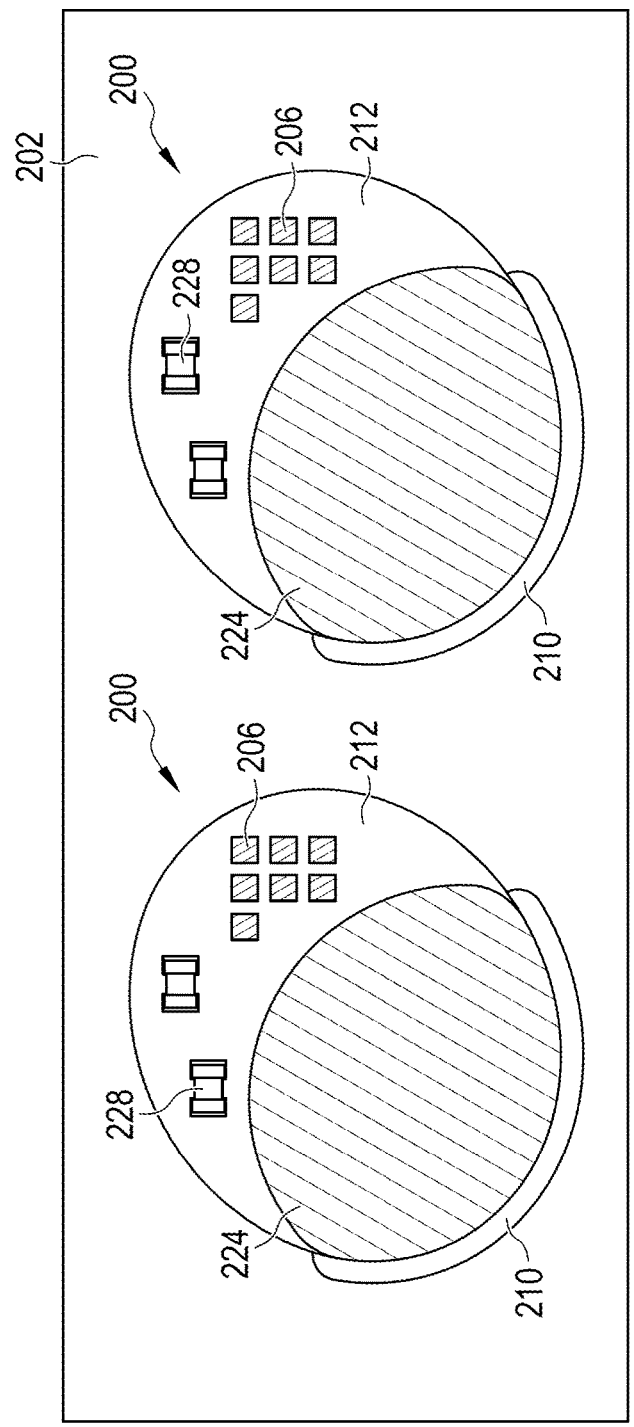
Figure 3O:
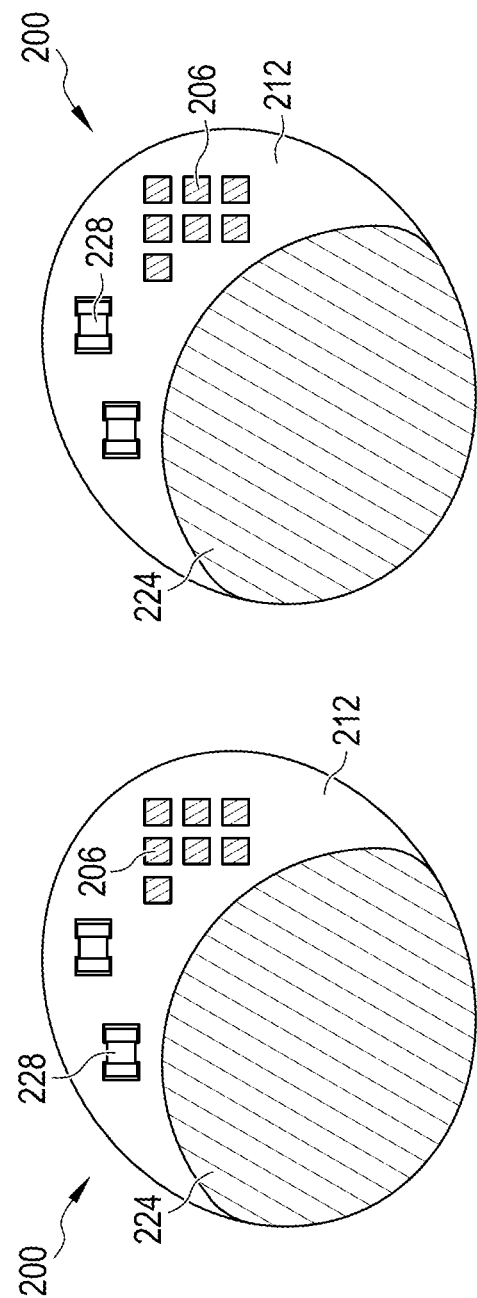

FIGS. 3a-3o illustrate forming shielded packages with a slotted printed circuit board or substrate to solve problems existing in the prior art. FIGS. 3a and 3b show an initial step of forming semiconductor packages 200 on substrate 202. FIG. 3a is a partial cross section and FIG. 3b shows a plan view. While only two units are shown being formed on one substrate, hundreds or thousands of packages 200 are commonly formed in a single substrate panel 202 using the same steps described herein but performed en masse.

Substrate 202 includes one or more insulating layers 204 interleaved with one or more conductive layers 206. Insulating layer 204 is a core insulating board in one embodiment, with conductive layers 206 patterned over the top and bottom surfaces, e.g., a copper-clad laminate substrate. Conductive layers 206 also include conductive vias electrically coupled vertically through insulating layers 204. Substrate 202 can include any number of conductive and insulating layers interleaved over each other. A solder mask or passivation layer can be formed over either side of substrate 202. Any suitable type of substrate or leadframe is used for substrate 202 in other embodiments.

Any components desired to implement the intended functionality of packages 200 are mounted to or disposed over substrate 202 and electrically connected to conductive layers 206. Components can be mounted onto the top and bottom surfaces of substrate 202 in any suitable configuration. In the disclosed embodiment, components mounted to substrate 202 at this stage are limited to region 208, which will be encapsulated in a subsequent manufacturing step. Semiconductor die 104 and discrete components 152 are surface mounted onto substrate 200 within region 208 of each package 200 using, e.g., any suitable pick and place method or device. Any suitable electrical component can be mounted within region 208 as desired.

A slot 210 is formed through substrate 202 adjacent to and along the boundary of each encapsulated region 208. Slot 210 is formed along region 208 so that, after being encapsulated, a shielding layer formed over region 208 can extend down into slot 210 and connect to a portion of conductive layer 206 exposed within the slot. Slot 210 is formed opposite to non-encapsulated package region 212, so that the slot corresponds to an area of substrate 202 that will need to be cut for singulation. Slot 210 could partially extend between regions 208 and 212 in some embodiments. Multiple slots 210 can be used at various locations along the boundary of region 208 rather that one long slot. Slots 210 extend completely through substrate 202 but could also be formed only partially through the substrate. Slots 210 expose conductive layer 206 from each region 208 at a side surface of substrate 202 so that a subsequently formed shielding layer will physically and electrically contact the conductive layers.

Slot 210 is formed during initial manufacturing of substrate 202, which is commonly done by a different manufacturer than the manufacturer forming packages 200 on the substrate. Forming slots 210 before manufacturing of packages 200 commences is simple for the substrate manufacturer and eases requirements for the semiconductor package manufacture. In other embodiment, the manufacturer of semiconductor packages 200 can form slots 210 using a laser, water jet, saw blade, router, or other type of cutting or machining tool.

In FIGS. 3c and 3d, an encapsulant 214 is deposited over region 208 using a paste printing, compressive molding, transfer molding, liquid encapsulant molding, vacuum lamination, spin coating, or other suitable applicator. Encapsulant 214 is limited to region 208 by pressing a mold against the top surface of substrate 202 and injecting encapsulant 214 into the mold. In other embodiments, encapsulant 214 entirely covers substrate 202 and then is removed outside of regions 208. In embodiments that use transfer molding or injection molding, encapsulant 214 is deposited using a mold with each chamber connected to adjacent chambers that allows the deposited molding compound to flow between packages 200. The areas of encapsulant 214 shown in FIG. 3d will be interconnected by paths or bridges of encapsulant between them after molding. The encapsulant path connecting the illustrated areas of encapsulant 214 is removed prior to completion of packages 200.

Encapsulant 214 can be polymer composite material, such as an epoxy resin, epoxy acrylate, or polymer with or without a filler. Encapsulant 214 is non-conductive and environmentally protects the semiconductor device from external elements and contaminants. Encapsulant 214 also protects semiconductor die 104 from degradation due to exposure to light. A side surface 215 of encapsulant 214 is coplanar with a side surface 216 of slot 210. In other embodiments, side surface 215 is laterally offset from side surface 216.

FIGS. 3e and 3f show masking substrate 202 outside of encapsulant 214 and slots 210 using a tape 220. Tape 220 completely covers substrate 202 outside of regions 208 and slots 210. A conductive material is sputtered over substrate 200 in FIGS. 3g and 3h to form a conductive shielding layer 224. Shielding layer 224 is formed using any suitable metal deposition technique, e.g., chemical vapor deposition, physical vapor deposition, other sputtering methods, spraying, or plating. The sputtered material can be copper, steel, aluminum, gold, titanium, combinations thereof, or any other suitable conductive material. In some embodiments, shielding layer 224 can be made by sputtering on multiple layers of differing material, e.g., stainless steel-copper-stainless steel or titanium-copper. Shielding layer 224 reduces electromagnetic interference (EMI) between the components of package 200 and other nearby electronic devices.

Shielding layer 224 is formed down side surface 215 of encapsulant 214 and into slot 210. In embodiments where surfaces 215 and 216 are not perfectly aligned, shielding layer 224 runs horizontally across substrate 202 between surface 215 and surface 216. Shielding layer 224 is grounded through conductive layers 206, which are exposed at side surface 216 of substrate 202. Slots 210 allow shielding layer 224 to contact side surface 216 without fully singulating each package 200 prior to sputtering. Therefore, subsequent processing steps described below are performed with substrate 202 remaining as a strip of devices rather than with singulated packages 200. Slot 210 can be formed in any arbitrary shape, so complex package shapes and designs are easily accommodated. Package 200 can be any suitable geometric shape, such as oval, circle, square, octagon, etc. Package 200 can also be an irregular shape, meaning not easily defined using vocabulary or mathematical expressions.

In FIGS. 3i and 3j, tape 220 is removed along with the portions of shielding layer 224 formed on the tape. Removing tape 220 exposes area 212 of packages 200, along with a plurality of contact pads of conductive layer 206 for mounting of components outside of encapsulant 214. Shielding layer 224 remains over encapsulant 214 in region 208.

External discrete components 228 are surface mounted onto substrate 202 in FIGS. 3k and 3l. Components 228 are reliably aligned with contact pads of conductive layer 206 because packages 200 remain connected to each other by substrate 202 and are unable to easily shift from their intended positions. With packages 200 completed, singulation occurs in FIGS. 3m and 3n by using a laser or other cutting tool 230 to cut around the boundaries of packages 200. Laser 230 cuts around packages 200 from one end of slot 210 to the other to completely singulate the packages. Slot 210 already has partially singulated packages 200, so the final singulation step takes less time than if the entire package boundary needed to be cut.

FIG. 3o shows completed packages 200 with shielding layer 224. Packages 200 are manufactured with a lower failure rate than the prior art because processing steps after formation of shielding layer 224 are performed with substrate 202 connecting each unit together as a strip. There is no need for a singulation step prior to forming shielding layer 224. Singulation is the final manufacturing step so shifting of units after singulation is less likely to cause manufacturing defects. Risks of unit-based handling are significantly reduced.

FIGS. 4a and 4b illustrate an alternative process flow. Continuing from the process step shown in FIGS. 3c and 3d, a mask 220a is formed over region 212 in FIG. 4a. Mask 220a is similar to tape 220 except only formed over regions 212 and not over substrate 202 as a whole. In FIG. 4b, shielding layer 224a is formed over substrate 202, packages 200, and mask 220a. Mask 220a is removed to expose regions 212 including contact pads of conductive layer 206. FIG. 4b shows a similar process step to FIG. 3j, except that shielding layer 224a remains covering substrate 202 outside of packages 200. The extra remaining portions of shielding layer 224a compared to shielding layer 224 are removed by the singulation step shown in FIGS. 3m and 3n. The end packages 200 being formed are not significantly different.

In some embodiments, the above-described packages, e.g., package 200, are a complete stand-alone electrical system that is fully functional by itself. A plastic molding or other type of case is made to hold substrate 202 in place within a product such as a wireless headphone or smart watch. Package 200 can have integrated antennae for Bluetooth, WiFi, or other protocols as well as a piezoelectric or other speaker to generate noise, a screen to display a watch face, and other desired electrical components. Additional electrical devices can be connected by wire or cable if needed within the same product case. Substrate 202 is the main board of the end device. There is no other main board that package 200 is connected to.

Figure 5A:
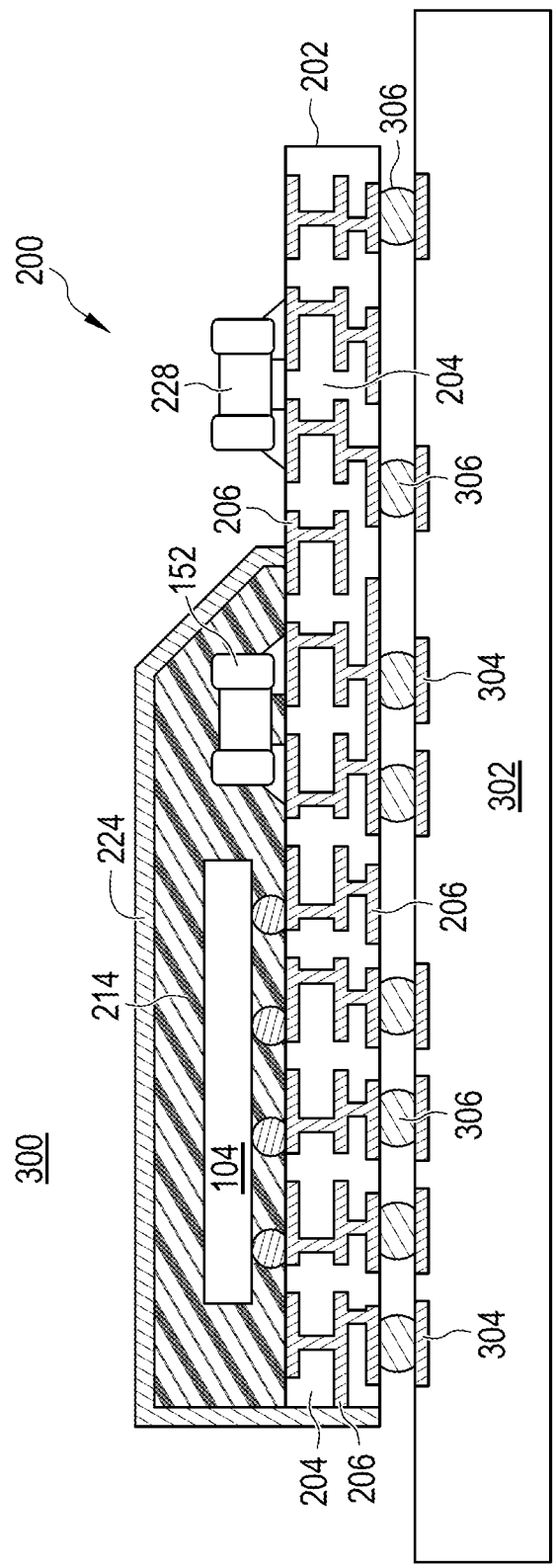
FIGS. 5a and 5b illustrate integrating the shielded semiconductor packages into an electronic device.
Figure 5B:
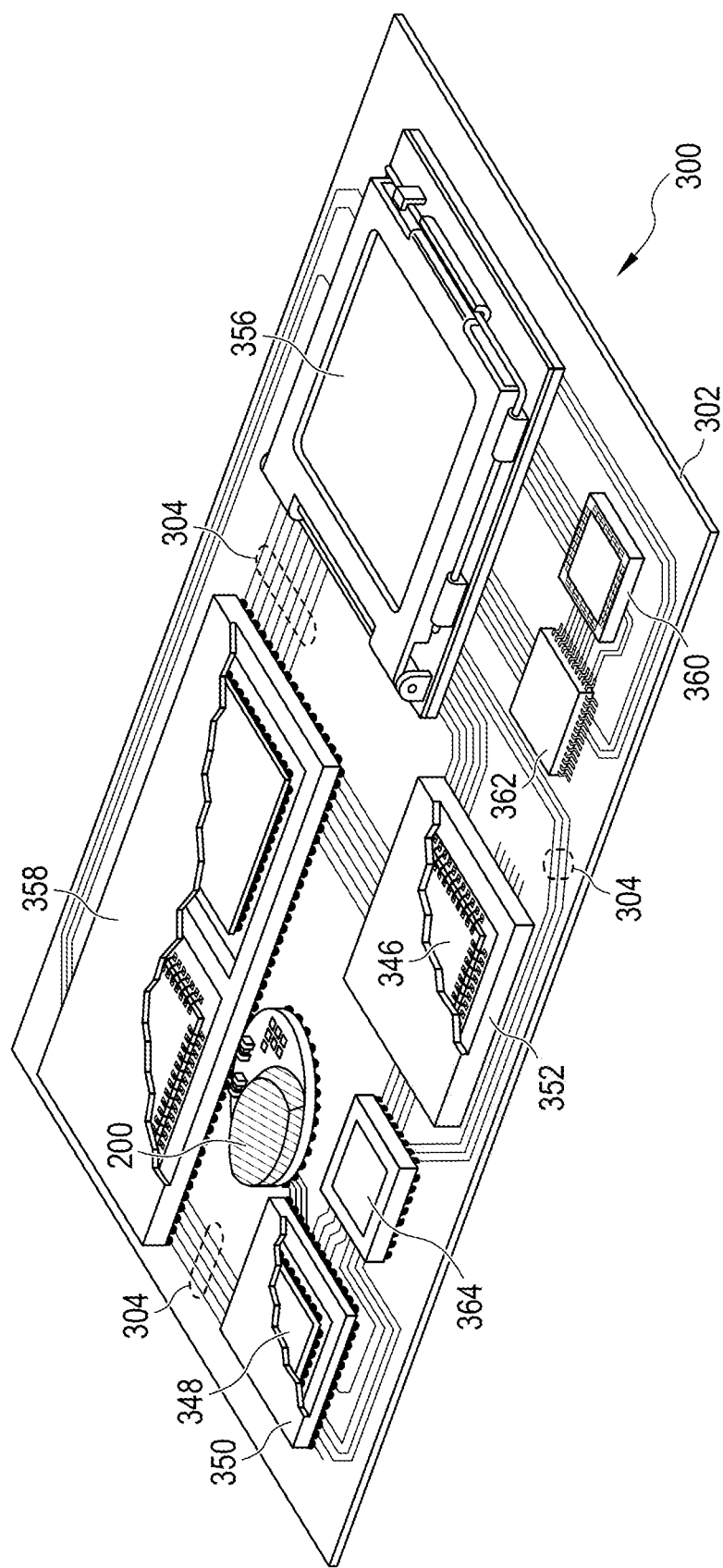

FIGS. 5a and 5b illustrate another embodiment where the above-described semiconductor packages, e.g., package 200, are integrated into a larger electronic device 300. FIG. 5a illustrates a partial cross-section of package 200 mounted onto a printed circuit board (PCB) or other substrate 302 as part of electronic device 300. Bumps 306 are formed on the bottom of substrate 202 during manufacturing, in a similar process to bumps 112 being formed on die 104, and then reflowed onto conductive layer 304 of PCB 302 to physically attach and electrically connect package 200 to the PCB. In other embodiments, thermocompression or other suitable attachment and connection methods are used. In some embodiments, an adhesive or underfill layer is used between package 200 and PCB 302. Semiconductor die 104 are electrically coupled to conductive layer 304 through substrate 202.

FIG. 5b illustrates electronic device 300 including PCB 302 with a plurality of semiconductor packages mounted on a surface of the PCB, including package 200. Electronic device 300 can have one type of semiconductor package, or multiple types of semiconductor packages, depending on the application. Electronic device 300 can be a stand-alone system that uses the semiconductor packages to perform one or more electrical functions. Alternatively, electronic device 300 can be a subcomponent of a larger system. For example, electronic device 300 can be part of a tablet computer, cellular phone, digital camera, communication system, or other electronic device. Electronic device 300 can also be a graphics card, network interface card, or another signal processing card that is inserted into a computer. The semiconductor packages can include microprocessors, memories, ASICs, logic circuits, analog circuits, RF circuits, discrete active or passive devices, or other semiconductor die or electrical components.

In FIG. 5b, PCB 302 provides a general substrate for structural support and electrical interconnection of the semiconductor packages mounted on the PCB. Conductive signal traces 304 are formed over a surface or within layers of PCB 302 using evaporation, electrolytic plating, electroless plating, screen printing, or other suitable metal deposition process. Signal traces 304 provide for electrical communication between the semiconductor packages, mounted components, and other external systems or components. Traces 304 also provide power and ground connections to the semiconductor packages as needed.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to PCB 302. In other embodiments, a semiconductor device may only have the first level packaging where the die is mechanically and electrically mounted directly to PCB 302.

For the purpose of illustration, several types of first level packaging, including bond wire package 346 and flipchip 348, are shown on PCB 302. Additionally, several types of second level packaging, including ball grid array (BGA) 350, bump chip carrier (BCC) 352, land grid array (LGA) 356, multi-chip module (MCM) 358, quad flat non-leaded package (QFN) 360, quad flat package 362, and embedded wafer level ball grid array (eWLB) 364 are shown mounted on PCB 302 along with package 200. Conductive traces 304 electrically couple the various packages and components disposed on PCB 302 to package 200, giving use of the components within package 200 to other components on the PCB.

Depending upon the system requirements, any combination of semiconductor packages, configured with any combination of first and second level packaging styles, as well as other electronic components, can be connected to PCB 302. In some embodiments, electronic device 300 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate including a plurality of conductive layers and a plurality of insulating layers interleaved between the conductive layers;
   forming a slot completely through the substrate;
   disposing a first electrical component over the substrate adjacent to the slot, wherein the substrate includes the plurality of conductive layers and the plurality of insulating layers prior to disposing the first electrical component over the substrate;
   depositing an encapsulant over the first electrical component and substrate after forming the slot, wherein a surface of the encapsulant is coplanar to a surface of the substrate within the slot, and wherein the slot remains devoid of the encapsulant;
   forming a shielding layer over the encapsulant and physically contacting the surface of the substrate within the slot; and
   singulating the substrate to form a semiconductor package with the first electrical component after forming the shielding layer.

2. The method of claim 1, further including singulating the substrate by cutting from a first end of the slot to a second end of the slot.

3. The method of claim 1, further including:
   disposing a mask over the substrate prior to forming the shielding layer; and
   removing the mask after forming the shielding layer.

4. The method of claim 1, wherein the semiconductor package is round.

5. The method of claim 1, further including disposing a second electrical component over the substrate after forming the shielding layer.

6. The method of claim 1, wherein a plurality of semiconductor packages remains connected by the substrate after the step of forming the shielding layer is complete.

7. A method of making a semiconductor device, comprising:
   providing a substrate including a conductive layer and an insulating layer;
   forming a slot completely through the substrate;
   disposing a first electrical component over the substrate after the substrate has already been formed to include the conductive layer and the insulating layer;
   depositing an encapsulant over the substrate after the slot is already formed in the substrate, wherein a surface of the encapsulant is adjacent to the slot and the slot remains devoid of the encapsulant;

forming a shielding layer over the encapsulant and extending over a surface of the substrate within the slot; and singulating the substrate to form a semiconductor package after forming the shielding layer.

8. The method of claim 7, further including singulating the substrate by cutting from a first end of the slot to a second end of the slot.

9. The method of claim 7, further including:

disposing a mask over the substrate prior to forming the shielding layer; and removing the mask after forming the shielding layer.

10. The method of claim 9, wherein the mask completely covers the substrate except for where the encapsulant was deposited.

11. The method of claim 7, wherein the semiconductor package is round or irregularly shaped.

12. The method of claim 7, further including disposing a second electrical component over the substrate after forming the shielding layer and prior to singulating the substrate.

13. The method of claim 7, wherein a plurality of semiconductor packages remains connected by the substrate after the step of forming the shielding layer is complete.

14. A method of making a semiconductor device, comprising:

providing a substrate including a slot formed completely through the substrate;

depositing an encapsulant over the substrate after the slot is formed completely through the substrate, wherein the slot remains devoid of the encapsulant;

forming a shielding layer over the substrate and into the slot; and singulating the substrate to form a semiconductor package after forming the shielding layer.

15. The method of claim 14, further including singulating the substrate by cutting from a first portion of the slot to a second portion of the slot.

16. The method of claim 14, further including:

disposing a mask over the substrate prior to forming the shielding layer; and removing the mask after forming the shielding layer.

17. The method of claim 14, wherein the semiconductor package is round.

18. The method of claim 14, further including disposing an electrical component over the substrate after forming the shielding layer.

19. The method of claim 14, wherein a plurality of semiconductor packages remains connected by the substrate after the step of forming the shielding layer is complete.

20. A method of making a semiconductor device, comprising:

providing a substrate including a slot formed in the substrate;

depositing an encapsulant over the substrate after the slot is already formed through the substrate, wherein the slot remains devoid of the encapsulant; and forming a shielding layer over the encapsulant and into the slot.

21. The method of claim 20, further including depositing the encapsulant with a surface of the encapsulant coplanar to a surface of the substrate within the slot.

22. The method of claim 20, further including:

disposing a mask over the substrate; and forming the shielding layer over the mask.

23. The method of claim 20, wherein the slot is curved.

24. The method of claim 20, further including disposing an electrical component over the substrate outside the encapsulant.

25. The method of claim 20, further including forming a plurality of semiconductor packages on the substrate.

* * * * *